Aug. 23, 1966 F. G. BANACH 3,268,815
MODULATION SIGNAL DISTORTION COMPENSATING SECRECY COMMUNICATION TRANSMITTER
Filed May 31, 1963
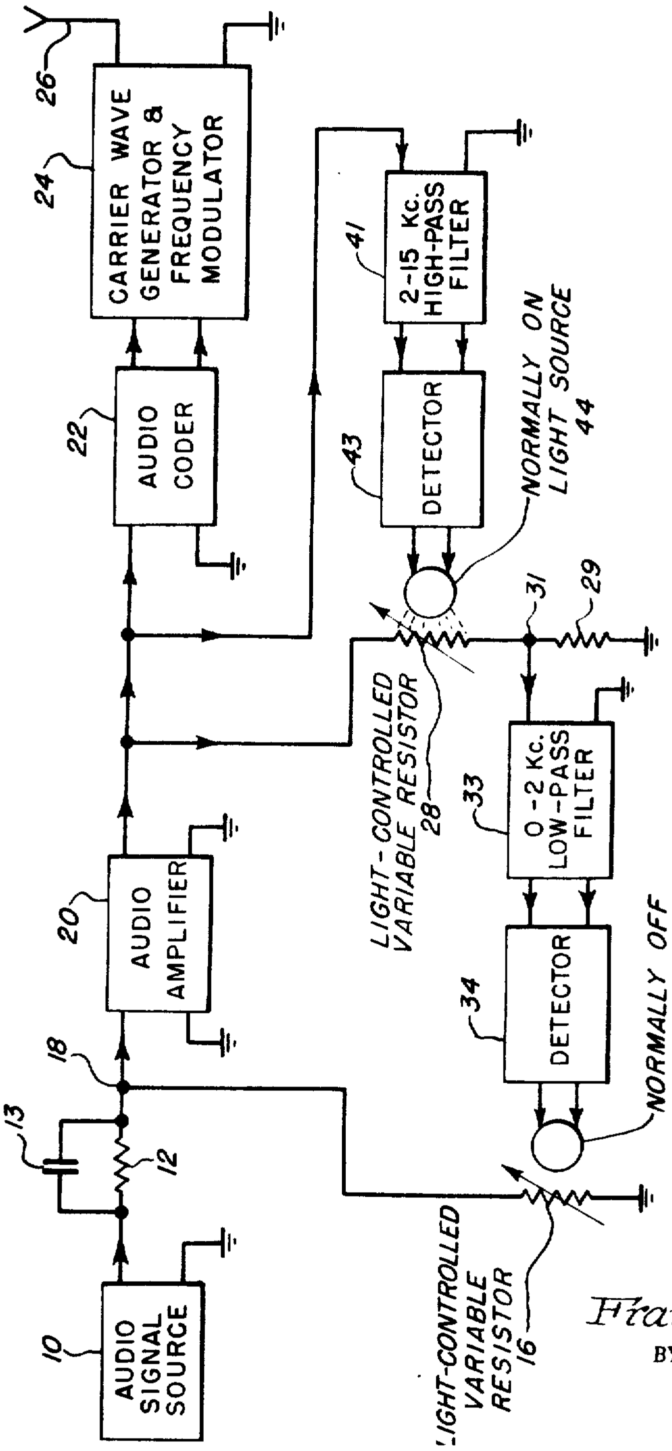
INVENTOR.
Frank G. Banach
BY James E. Tracy
Atty.

3,268,815
Patented August 23, 1966

3,268,815

MODULATION SIGNAL DISTORTION COMPENSATING SECRECY COMMUNICATION TRANSMITTER

Frank G. Banach, Chicago, Ill., assignor to Zenith Radio Corporation, Chicago, Ill., a corporation of Delaware Filed May 31, 1963, Ser. No. 284,502
9 Claims. (Cl. 325—122)

This invention relates in general to a secrecy communication transmitter for producing a coded audio signal to be radiated to, and decoded in, a companion secrecy communication receiver. More particularly, the invention pertains to a secrecy communication transmitter for selectively attenuating or compressing low-frequency components of the audio signal, before coding, but only when those components are unaccompanied by high-frequency audio signal components. Such an alteration of the audio signal, before it is subjected to a coding function, overcomes a distortion problem that may otherwise manifest in the companion receiver.

There are many different coding techniques for coding an audio signal which may result, when the complementary decoding technique is employed for decoding at the receiver, in the introduction of noticeable and annoying audible distortion in the decoded audio signal. For example, such distortion may become manifest in the decoded audio signal when a frequency shift or displacement type of coding is utilized wherein frequencies of at least some of the components of the uncoded audio signal are changed to other frequencies. One well known frequency shift coder varies the frequencies of all of the audio signal components merely by heterodyning the entire audio signal to a portion of the frequency spectrum where it does not normally reside.

For instance, very effective audio scrambling has been achieved by frequency displacing the audio signal by 2625 cycles per second (c.p.s.) by means of heterodyning techniques. In this way, 2625 c.p.s. is added at the transmitter to the frequency of each of the original audio components. To effect decoding at the receiver, the scrambled audio components are heterodyned back to their original frequencies. In other words, 2625 c.p.s. is subtracted from the frequency of each of the coded audio components.

Of course, before the coded audio signal may be unscrambled at the receiver it is first necessary to separate that signal, by means of a detector or demodulator, from the carrier on which it is conveyed from the transmitter. Many audio detectors produce harmonic distortion, and this is particularly characteristic of frequency modulation (FM) detectors which are necessarily required at the receivers when the coded audio signal is frequency modulated on the carrier signal. The amount of harmonic distortion is a function of the amplitude of the coded audio and in especially pronounced on high amplitude audio signals represented by full or near-full deviation from the mean carrier frequency in FM transmission. Many FM detectors are capable of introducing a significant amount of harmonics in the process of detecting full deviation or close-to-full deviation frequency modulation.

In conventional non-secrecy FM receivers, the development of harmonic distortion presents no problem. Harmonics of uncoded audio do not noticeably detract from the fidelity and in many cases even enhance or enrich the fidelity. Unfortunately, this is not true of secrecy systems in general and in particular secrecy systems of the type which code by altering the frequencies of the audio signal since the harmonics of the coded audio components, developed in the detector, are converted to non-harmonics in the decoder and these non-harmonics may introduce appreciable audible distortion.

To explain, in the above-described system considered by way of example, a typical uncoded audio signal component, of say 710 cycles per second, is converted in the audio scrambler to a signal of 2625+710 or 3335 c.p.s. and is then frequency modulated onto a carrier for transmission to the companion receivers. In the process of demodulating or separating the coded audio from the carrier at the receiver, the 3335 c.p.s. component is detected but in so doing harmonics thereof are also introduced in the coded audio developed at the output of the demodulator; the second harmonic exhibits a frequency of 6670 c.p.s., the third harmonic a frequency of 10,005 c.p.s., and the fourth harmonic a frequency of 13,340 c.p.s., etc. The magnitude of all of the harmonics is determined by the amplitude of the 3335 c.p.s. component, and as mentioned previously, if the component is of a high amplitude, being represented by full or close-to-full deviation from the mean carrier frequency, the amplitudes of the harmonics are relatively high.

In the audio decoder, 2625 c.p.s. is subtracted from every frequency component applied thereto. Hence, the 3335 c.p.s. component is converted back to its original 710 c.p.s. However, the second, third and fourth harmonics are converted respectively to 6670−2625 or 4045 c.p.s., 10,005−2625 or 7380 c.p.s., and 13,340−2625 or 10,715 c.p.s., which resulting components all lie in the audible range of the frequency spectrum and are not harmonically related to 710 c.p.s. As a consequence, the 4045, 7380 and 10,715 c.p.s. components introduced in the decoded audio signal represent definite non-harmonic distortion.

It is an object of the present invention to produce a coded audio signal that will not effect the development of such non-harmonic distortion.

Of course, the distortion may be avoided, or at least minimized, by attenuating or compressing the entire audio signal at the transmitter so that the carrier is never frequency modulated to full deviation or even near-full deviation. Obviously, such an expedient would reduce considerably the signal-to-noise ratio, thereby decreasing broadcast geographic coverage. The present invention precludes the introduction of noticeable non-harmonic distortion in the receivers without materially reducing signal strength.

Since the frequencies of the non-harmonic components are geared to and are above the frequencies of the original uncoded audio components, it has been discovered that the higher frequency audio components (above around 2000 c.p.s.) result in non-harmonic components of frequencies sufficiently high that they either lie above the audible range or are so high in that range that they present no noticeable audible distortion. It is only the lower audio frequencies, up to approximately 2000 c.p.s., that produce noticeable distortion. It has also been discovered that even the low-frequency components present no noticeable distortion when those components are accompanied by high-frequency audio. This obtains because the non-harmonics, produced by the low frequencies, are masked or camouflaged by the high-frequency audio components and thus cannot be heard. As a consequence, the distortion problem exists only when low-frequency audio is present in the absence of high-frequency components which exceed a minimum threshold amplitude. The present application achieves the avoidance of audible distortion, without significantly decreasing the signal strength, by selectively compressing the low-frequency components except when high-frequency audio, of a predetermined minimum amplitude level, is present.

It is, therefore, another object of the present invention to provide a secrecy communication transmitter for developing a coded audio signal in which low frequencies are attenuated except when they are accompanied by high frequencies.

It is another object to provide a new and improved secrecy communication transmitter.

A secrecy communication transmitter, constructed in accordance with the invention, comprises an audio signal source for producing an audio signal. Attenuating means, coupled to the source, responds to the presence of low-frequency components of the audio signal for attenuating those components. Frequency-selective disabling means are coupled to the source and in response to the presence of high-frequency components of the audio signal the disabling means at least partially disables the attenuating means. Audio coding apparatus is coupled to the source and to the attenuating means for coding the resulting audio signal.

The features of this invention which are believed to be new are set forth with particularity in the appended claims. The invention, together with further objects and advantages thereof, may best be understood, however, by reference to the following description taken in conjunction with the accompanying drawing, the single figure of which illustrates a secrecy communication FM transmitter constructed according to the invention.

Turning now to a structural description of the illustrated transmitter, an audio signal source 10, which may constitute a conventional microphone and audio amplifier, has one of its output terminals directly connected to a plane or reference potential, such as ground, while its other output terminal is also coupled to ground except through a voltage divider which includes in the order named a parallel combination, of a fixed resistor 12 and a capacitor 13, series-connected with a variable impedance device in the form of a light-controlled or light-dependent variable resistor 16. Specifically, resistor 16 may constitute a photo-resistive, cadmium sulfide cell which presents a resistance inversely proportional to the amount of light to which the cell is exposed. In other words, the resistance decreases with increasing light, and increases in response to reduced light.

The junction 18 of parallel combination 12, 13 and variable impedance device 16 is coupled to one input terminal of an audio amplifier 20, the other input terminal of which is grounded. One of the output terminals of the amplifier is also connected to ground while the other is coupled to one input terminal of an audio coder 22, whose other input terminal is grounded. Audio coder 22 may take any one of a multiplicity of different forms; the only requirement is that it successfully scramble the audio intelligence by utilizing a coding technique which, in the absence of the present invention, would result in the production of noticeable audible distortion in the decoded audio at the receiver. Coder 22 may, for example, be a frequency shift coder of the type described hereinbefore in which heterodyning techniques are employed to displace the audio information, which originally contains frequency components from 0–15,000 c.p.s., to a portion of the frequency spectrum where it does not normally reside. Specially, the audio signal is shifted or moved by exactly 2625 c.p.s. to a higher portion of the frequency spectrum, namely to the frequency range from 2625–17,625 c.p.s. A frequency displacement by that amount achieves very effective audio coding inasmuch as a receiver, not equipped with suitable compensating decoding circuitry, would be unable to unscramble the audio and derive any intelligence therefrom.

It is appropriate to explain why the frequency displacement has been set at 2625 c.p.s. It is contemplated that the illustrated transmitter may be made part of a secrecy television transmitter for coding the audio portion of a telecast. Frequency shifting of 2625 c.p.s. results in a coded audio signal covering a portion of the frequency spectrum, specificially from 2625 to 17,625 c.p.s., which may be conveniently frequency modulated on the audio carrier in the television transmitter while at the same time complying with the television transmission standards presently existing in the United States. Moreover, a frequency displacement of 2625 c.p.s. has been chosen since that number is related to the horizontal or line scanning frequency in the United States (15,750 c.p.s.), which permits convenient development of appropriate heterodyning signals for achieving coding at the transmitter and complementary decoding at the receiver.

To elucidate, the desired frequency shift may be obtained by coder 22 at the transmitter by initially utilizing the horizontal synchronizing signal, whose frequency of 15,750 c.p.s. is called H for convenience, to develop a first sinusoidal heterodyning signal having a frequency which equals 3H or $3\times15,750$ or 47,250 c.p.s. The original uncoded audio signal, having components extending from zero to 15,000 c.p.s., is beat with the first heterodyning signal in a first modulator and the lower side band, extending from 32,250 to 47,250 c.p.s., of the resulting signal is filtered out or separated. A second sinusoidal heterodyning signal is produced from and synchronized by the horizontal sync signal and is arranged to exhibit a frequency of 3⅙H or 49,875 c.p.s. A second modulator heterodynes the lower side band (32,250–47,250 c.p.s.) from the output signal of the first modulator with the second heterodyning signal and the lower sideband of the resultant signal, which will extend from 2625 to 17,625 c.p.s., is selected. The components in the range 2625 to 17,625 c.p.s. constitute the coded audio since all of the original audio components have now been displaced by 2625 c.p.s.

By relating or gearing the first and second heterodyning signals used in audio coder 22 to the horizontal scanning frequency or H, it is convenient to develop appropriate heterodyning signals from the horizontal synchronizing signal available in the receiver in order to achieve unscrambling. One way in which this may be done contemplates the production of a first sinusoidal heterodyning signal having a frequency equal to 2H or 31,500 c.p.s. which heterodynes the received coded audio signal (2625–17,625 c.p.s.) in a first demodulator to develop an upper sideband extending from 34,125 to 49,125 c.p.s. This sideband in turn may be heterodyned in a second demodulator with a second sinusoidal heterodyning signal having a frequency equal to 2⅙H or 34,125 c.p.s. and the lower sideband, which would extend from zero to 15,000 c.p.s., may be filtered out of the output of the second demodulator to provide the decoded audio signal.

Returning now to the illustrated transmitter, the output of audio coder 22 is coupled to the input of a carrier wave generator and frequency modulator 24, the output of which is coupled to a transmitting antenna 26.

The ungrounded output terminal of audio amplifier 20 is also coupled to ground through a voltage divider which includes a variable impedance device, in the form of a light-controlled variable resistor 28, and a series-connected fixed resistor 29. As in the case of resistor 16, resistor 28 may comprise a photo-resistive, cadmium sulfide cell which presents an impedance of a magnitude inversely proportional to the amount of light directed thereto. The junction 31 between variable impedance device 28 and fixed resistor 29 is coupled to one input terminal of a low-pass filter 33, whose other input terminal is grounded. Filter 33 is constructed to accept only those audio signal components having frequencies below 2000 c.p.s. The output of the filter is in turn connected to a detector 34 which is of the type that produces a D.C. control voltage of a magnitude determined by the average peak amplitude of an audio signal applied to its input. The output terminals of detector 34 are coupled to a light source or lamp 36 which is physically located in close proximity to variable resistor 16 in order that the light source may control the resistance of the resistor, namely in order that the resistance of resistor 16 may be determined by the instantaneous intensity of source 36.

For example, light source 36 may comprise a tuning indicator tube of the turning-eye type. Such a tube contains a phosphor area which emits light of an intensity determined by, and proportional to, the plate current of the tube. The D.C. control voltage developed at the output of detector 34 may be employed to control that plate current by varying the plate voltage. Specifically, an increasing D.C. control voltage increases the plate voltage, causing an increase in plate current with a resulting increase in light intensity. For reasons to be explained later, light source 36 is normally conditioned or biased so that in the absence of a D.C. control voltage from detector 34 of a magnitude exceeding a predetermined minimum threshold level no plate current flows through the tuning indicator in source 36 in order that the phosphor will emit no light. Since light source 36 is normally biased to its off condition, it is so labeled in the drawing.

The ungrounded output terminal of audio amplifier 20 is further coupled to one input terminal of a high-pass filter 41, the other input terminal of which is grounded. Filter 41 is designed to select only those audio signal components which exhibit frequencies above 2000 c.p.s. The output of filter 41 is connected to the input of a detector 43 whose output in turn is coupled to a light source 44 which is physically located in close proximity to variable resistor 28 in order that the resistance of that resistor may be controlled by varying the intensity of the light source. Detector 43 and light source 44 may be of similar construction to detector 34 and light source 36, respectively. In other words, light source 44 may constitute a conventional tuning indicator tube of the tuning-eye type whose plate current is controlled by a D.C. control voltage produced in the output of detector 43, which control voltage has a magnitude determined by the average peak amplitude of the audio signal components supplied to its input. Unlike source 36, however, tuning indicator 44 operates in a reverse manner and is normally biased so that in the absence of an applied D.C. control voltage, maximum plate current flows causing the phosphor in the tube to emit maximum light. An increasing D.C. control voltage from detector 43 effects a decrease in the plate current in the tuning indicator of source 44, thereby resulting in a reduction in the light intensity. Hence, source 44 has been labeled a "normally on light source" in the drawing.

In operation, signal source 10 produces an audio signal having frequency components falling in the audible portion of the frequency spectrum; specifically, the components extend from zero to approximately 15,000 c.p.s. The higher frequency components, such as from 2000 to 15,000 c.p.s., are essentially translated through condenser 13 to the input of audio amplifier 20. Actually, the high frequencies do appear across the voltage divider comprising fixed impedance device 12, 13 and variable impedance device 16, but capacitor 13 is established at such a capacitance, preferably 7500 micromicrofarads, that parallel combination 12, 13 presents a very low impedance with respect to the high-frequency audio components as compared to the impedance of resistor 16 no matter what its resistance may be. There is therefore substantially no voltage drop of the high frequencies across impedance device 12, 13 so that those components, without any attenuation, appear between junction 18 and ground regardless of the resistance of resistor 16. The high frequencies are amplified in amplifier 20 and are then applied to the input of audio coder 22.

The lower audio frequencies, below 2000 cycles, are, however, attenuated in an amount determined by the instantaneous impedance of resistor 16 in the absence of high frequencies. This obtains since the parallel combination of resistor 12 and capacitor 13 presents an appreciable impedance with respect to the low-frequency audio. There is a voltage drop across that fixed impedance in an amount determined by the resistance of resistor 16 because of the voltage divider arrangement. In the absence of high-frequency audio exceeding a predetermined minimum amplitude level, the low-frequency components developed between junction 18 and ground are amplified in amplifier 20 and appear across the voltage divider consisting of variable impedance device 28 and fixed impedance device 29. Since light source 44 is biased to be normally on resistor 28, being light-controlled, presents a relatively low resistance due to the fact that its resistance is inversely proportional to the amount of light incident thereon. Resistor 28 therefore represents a low impedance path for the low frequencies in order that those frequency components appear substantially across resistor 29 and thus at the input of low-pass filter 33.

The positive peak amplitudes of the low-frequency audio components developed in the output of filter 33 are rectified and detected in detector 34 in order to supply to light source 36 a D.C. control voltage of a magnitude determined by and proportional to the average peak amplitudes. As a consequence, the greater the amplitude of the low frequencies, the greater will be the magnitude of the D.C. control voltage. Since that voltage controls the degree of intensity of light source 36, the source will illuminate to an extent directly proportional to the amplitude of the low-frequency components. Inasmuch as the resistance of resistor 16 decreases with increasing light, the impedance from junction 18 to ground is inversely proportional to the magnitude of the low-frequency components, the impedance going down with an increasing magnitude of low-frequency audio and up with a decreasing amplitude.

Because of the voltage dividing arrangement of units 12, 13 and 16, a decrease in resistance of resistor 16 effects an increase in the voltage drop across impedance device 12, 13 with a corresponding voltage drop decrease through resistor 16. Accordingly, the low-frequency components, in the absence of high frequencies, are effectively attenuated since it is the low frequency audio components developed across resistor 16 that are further translated to audio amplifier 20 and thence to coder 22 for scrambling. Of course, by appropriately adjusting the parameters in the circuit the amount of attenuation or compression to which the low frequency audio components are subjected, in the absence of high frequency audio, may be adjusted to any desired degree. Preferably, the low frequencies are compressed only to the extent that the frequency modulation of the carrier does not extend to full or even close-to-full deviation since that is the condition which is principally responsible for the introduction of audible distortion in the receiver as mentioned hereinbefore.

As also indicated earlier, it has been discovered that any distortion introduced by the transmission of low-frequency components is sufficiently masked by high-frequency audio, when those high frequency components are present. Accordingly, the present invention provides frequency-selective disabling means which respond to the presence of high-frequency components in the audio signal for at least partially disabling the attenuating means. In this way, the system may be arranged to effect no appreciable attenuation of the low frequencies, when high frequencies concurrently occur, or alternately may be made to effect only a relatively small desired compression.

To explain, high-pass filter 41 accepts the higher frequencies, 2000–15,000 c.p.s., from the audio signal when they are present and supplies them to detector 43 which in turn rectifies the positive peaks to produce a D.C. control voltage having a magnitude determined by the average peak amplitude. Since light source 44 is biased to be normally energized to direct light on variable resistor 28, the D.C. control voltage from detector 43 is employed in a reverse sense to the utilization of the control voltage from detector 34 and effects a decrease in the intensity of light source 44 in an amount proportional to the magnitude of the D.C. control voltage. As a consequence, the intensity of light source 44 is inversely proportional to the magnitude of the high-frequency components. Light source 44 controls the resistance instantaneously presented by variable impedance 28 and therefore that impedance, which decreases with increasing light, is directly proportional to the amplitude of the high frequencies, the resistance going up with an increasing magnitude of high-frequency components and reducing with a decrease.

Since resistor 28 normally provides a coupling means from the output of audio amplifier 20 to the input of low-pass filter 33, increasing the resistance of that resistor, in response to the presence of high frequencies, effectively achieves at least partial decoupling of the low-frequency attenuating means from audio signal source 10. The greater the amplitude of the high frequencies, the greater will be the resistance of resistor 28 and since that resistor constitutes a voltage divider in conjunction with resistor 29, the smaller will be the voltage drop across resistor 29 with respect to the low frequencies. Thus, the low-frequency attenuating means may be disabled to a desired extent in the presence of high-frequency components by decreasing the amplitude of the low frequencies applied to low-pass filter 33 at that time since the D.C. control voltage developed in detector 34 is directly proportional to the amplitude of the audio supplied to filter 33.

Thus, the attenuating means is operative to effect substantial compression of the audio signal only during those intervals when low-frequency components exist in the absence of high-frequency audio. During those intervals in which both low and high frequencies are concurrently present, and moveover during those intervals in which only high frequencies exist, the audio signal is subjected to no appreciable compression in the preferred embodiment.

Actually, low-pass filter 33 is not necessary because of the presence of condenser 13. To elucidate, even though the high frequencies, which of course will develop across resistors 28 and 29, would be permitted to reach detector 34, with filter 33 removed, and thus control the resistance of resistor 16, as mentioned previously impedance device 12, 13 represents such a low impedance at the high frequencies that substantially the entire audio signal developed at the output of source 10 is dropped, voltage-wise, across resistor 16 no matter what its resistance may be. To insure that the impedance from junction 18 to ground is always high with respect to the impedance across condenser 13, for high frequencies, a fixed resistor may be added in series with resistor 16.

The scrambled audio developed in the output of coder 22 is applied to the frequency modulator of unit 24. The carrier wave generator in unit 24 supplies a carrier wave to the modulator which operates in conventional fashion to produce at its output a carrier wave on which the coded audio has been frequency modulated. This output signal is then radiated to companion receivers by means of transmitting antenna 26.

It may be desirable to effect attenuation of the low frequencies even though they are accompanied by very high frequency audio. It has been found that the high-frequency audio components in the range from 2000 to 7000 c.p.s. are most effective in masking the non-harmonics produced by the low frequencies. If both low frequencies, below 2000 c.p.s., and very high frequencies, above 7000 c.p.s., are present in the audio signal in the absence of high frequencies in the 2000–7000 c.p.s. range, there may be insufficient masking. In that case, it may be preferred to modify the described embodiment in order to attenuate the low frequencies except when high frequencies in the 2000–7000 c.p.s. range exist. This may be done merely by constructing high-pass filter 41 so that it accepts only audio components having frequencies between 2000 and 7000 c.p.s. In this way, very high frequency audio (above 7000 c.p.s.) will not render the attenuating means ineffective.

The invention has therefore provided a novel secrecy communication transmitter which permits the utilization of certain coding techniques, which techniques in the past have precipitated noticeable audible distortion in the decoded audio signal at the receiver, while at the same time such distortion is precluded by selectively compressing only those portions of the audio signal responsible for the distortion.

While a particular embodiment of the invention has been shown and described, modifications may be made, and it is intended in the appended claims to cover all such modifications as may fall within the true spirit and scope of the invention.

I claim:

1. A secrecy communication transmitter comprising:
an audio signal source for producing an audio signal;
attenuating means for attenuating applied low-frequency components;
means for applying at least the low-frequency components of said audio signal to said attenuating means to effect attenuation thereof;
frequency-selective control means, the output of which is coupled to said attenuating means, responsive to applied high-frequency components for varying the effectiveness of said attenuating means to change the amount of low frequency attenuation inversely with the amplitude of the applied high-frequency components;
means for applying at least the high-frequency components of said audio signal to said frequency-selective control means to vary the effectiveness of said attenuating means;
audio coding apparatus;
and means for applying the audio signal, as modified by said attenuating means, to said coding apparatus to achieve coding.

2. A secrecy communication transmitter according to claim 1 in which said coding apparatus is of the frequency-shift type for changing the frequencies of at least some of the components of the modified audio signal to achieve coding.

3. A secrecy communication transmitter according to claim 1 in which said audio signal produced by said source has frequency components falling in the audible portion of the frequency spectrum and wherein said coding apparatus is of the frequency-shift type for heterodyning the modified audio signal to a different portion of the frequency spectrum to achieve coding.

4. A secrecy communication transmitter according to claim 1 in which said low-frequency and high-frequency components are respectively in mutually exclusive frequency ranges.

5. A secrecy communication transmitter according to claim 1 including means coupled to said coding apparatus for frequency-modulating the coded audio signal onto a carrier for transmission to secrecy communication receivers.

6. A secrecy communication transmitter according to claim 1 in which said attenuating means attenuates the low-frequency components of said audio signal in an amount which varies directly with the amplitude of the low-frequency components applied to said attenuating means.

7. A secrecy communication transmitter according to claim 6 wherein said attenuating means includes a variable impedance device, coupled at least partially in shunt with the output of said source, the impedance of which is varied inversely with the amplitude of the low-frequency components applied to said attenuating means.

8. A secrecy communication transmitter according to claim 6 in which said frequency-selective control means varies the effectiveness of said attenuating means by changing the amplitude of the low-frequency components applied to said attentuating means inversely with the amplitude of the high-frequency components of said audio signal.

9. A secrecy communication transmitter according to claim 8 in which said signal applying means for said attenuating means includes a series-connected variable impedance device and wherein said frequency-selective control means varies the impedance of said device directly with the amplitude of the high-frequency components of said audio signal.

References Cited by the Examiner

UNITED STATES PATENTS

| | | | |
|---|---|---|---|
| 1,998,824 | 4/1935 | Steinberg | 179—15.55 |
| 2,358,045 | 9/1944 | Barney | 333—14 |
| 2,407,259 | 9/1946 | Dickieson | 179—1.5 |
| 3,182,271 | 5/1965 | Aiken | 330—59 |

DAVID G. REDINBAUGH, *Primary Examiner.*

B. V. SAFOUREK, *Assistant Examiner.*